(12) United States Patent
Berben

(10) Patent No.: US 9,587,799 B2
(45) Date of Patent: Mar. 7, 2017

(54) LED ILLUMINATION DEVICE HAVING WAVELENGTH CONVERTING ELEMENT

(75) Inventor: Dirk Berben, Herdecke (DE)

(73) Assignee: OSRAM GmbH, Munich (DE)

( * ) Notice: Subject to any disclaimer, the term of this patent is extended or adjusted under 35 U.S.C. 154(b) by 248 days.

(21) Appl. No.: 14/349,339

(22) PCT Filed: Aug. 23, 2012

(86) PCT No.: PCT/EP2012/066435
§ 371 (c)(1),
(2), (4) Date: Apr. 3, 2014

(87) PCT Pub. No.: WO2013/053524
PCT Pub. Date: Apr. 18, 2013

(65) Prior Publication Data
US 2014/0233214 A1    Aug. 21, 2014

(30) Foreign Application Priority Data

Oct. 13, 2011 (DE) .................. 10 2011 084 406

(51) Int. Cl.
*F21V 9/16* (2006.01)
*H01L 33/50* (2010.01)
*H05B 33/14* (2006.01)

(52) U.S. Cl.
CPC ............. *F21V 9/16* (2013.01); *H01L 33/501* (2013.01); *H05B 33/14* (2013.01)

(58) Field of Classification Search
CPC ........ F21V 3/0463; F21V 3/0481; F21V 9/00; F21V 9/16; H01L 33/50; H01L 33/501; H01L 33/507
See application file for complete search history.

(56) References Cited

U.S. PATENT DOCUMENTS

| | | | | |
|---|---|---|---|---|
| 4,028,118 A | * | 6/1977 | Nakasuji | ............... C08K 5/0041 |
| | | | | 106/31.19 |
| 4,920,991 A | * | 5/1990 | Shibahashi | ............ A45D 31/00 |
| | | | | 132/73 |
| 5,083,251 A | * | 1/1992 | Parker | ..................... F21V 17/04 |
| | | | | 362/255 |
| 5,352,649 A | * | 10/1994 | Shibahashi | .............. A61K 8/02 |
| | | | | 101/491 |

(Continued)

FOREIGN PATENT DOCUMENTS

| | | |
|---|---|---|
| CN | 1612247 A | 5/2005 |
| CN | 102116424 A | 7/2011 |

(Continued)

OTHER PUBLICATIONS

Chinese Office Action based on Application No. 201280050271.7(7 Pages and 6 pages of English translation) dated Feb. 23, 2016 (Reference Purpose Only).

(Continued)

*Primary Examiner* — Ismael Negron

(74) *Attorney, Agent, or Firm* — Viering, Jentschura & Partner mbB

(57) ABSTRACT

An LED illumination device includes a wavelength converting element having a matrix material, at least one phosphor, and a thermochromic dye component or a phase change medium component.

11 Claims, 2 Drawing Sheets

(56) References Cited

U.S. PATENT DOCUMENTS

| | | | | |
|---|---|---|---|---|
| 5,688,592 A * | 11/1997 | Shibahashi | ............ | B32B 27/18 |
| | | | | 428/323 |
| 5,870,072 A | 2/1999 | Tuli | | |
| 7,768,693 B2 * | 8/2010 | McCarthy | ............... | G02B 5/223 |
| | | | | 250/517.1 |
| 8,363,307 B2 * | 1/2013 | McCarthy | ............. | B82Y 20/00 |
| | | | | 257/89 |
| 8,432,500 B2 * | 4/2013 | Van Bommel | ............ | F21K 9/00 |
| | | | | 349/22 |
| 2005/0094533 A1 * | 5/2005 | Gibson | .................. | B82Y 10/00 |
| | | | | 369/100 |

FOREIGN PATENT DOCUMENTS

| | | |
|---|---|---|
| CN | 102159881 A | 8/2011 |
| DE | 69205230 T2 | 3/1996 |
| DE | 202007015925 U1 | 3/2008 |
| WO | 2007120855 A2 | 10/2007 |
| WO | 2010035171 A1 | 4/2010 |

OTHER PUBLICATIONS

International Search Report issued in the corresponding PCT application No. PCT/EP2012/066435, dated Jan. 4, 2013.
Office Action issued in the corresponding German application No. 102011084406.6, dated Aug. 3, 2012.

* cited by examiner

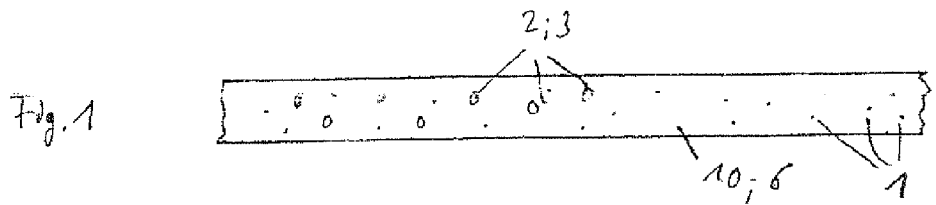
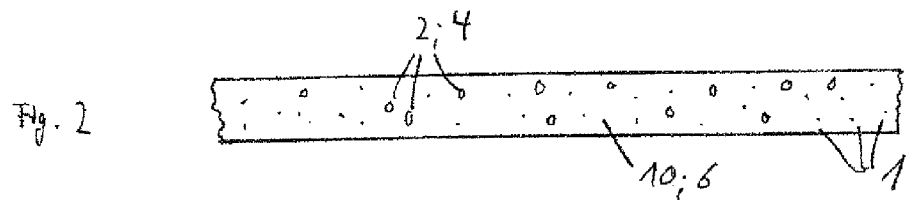
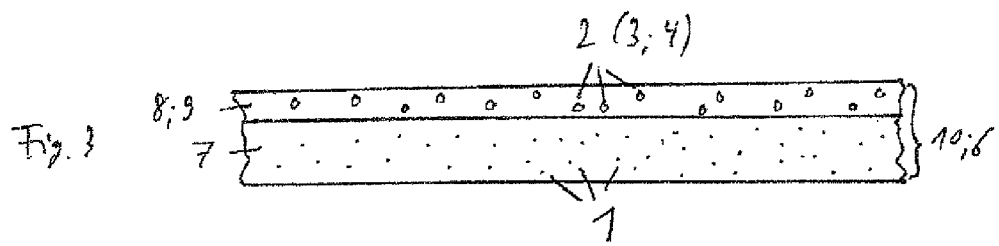
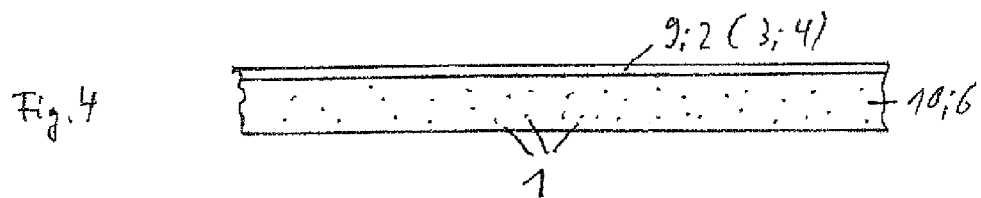
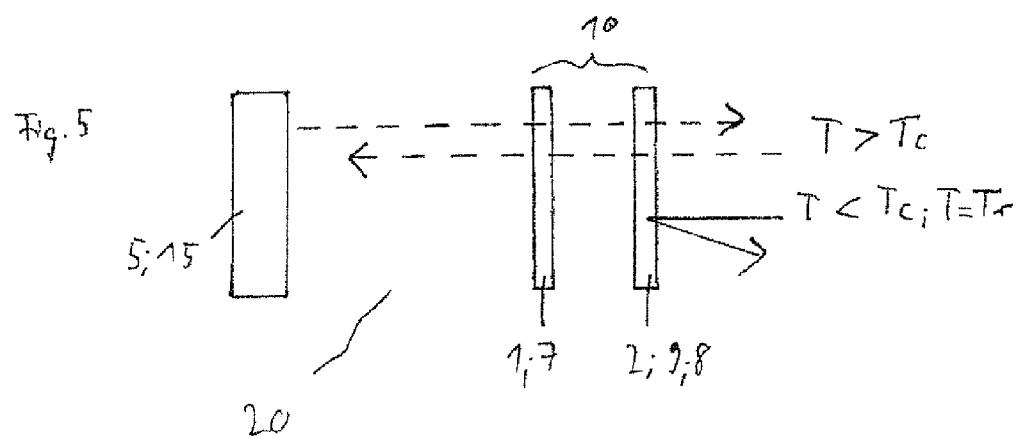

LED ILLUMINATION DEVICE HAVING WAVELENGTH CONVERTING ELEMENT

RELATED APPLICATIONS

The present application is a national stage entry according to 35 U.S.C. §371 of PCT application No.: PCT/EP2012/066435 filed on Aug. 23, 2012, which claims priority from German application No.: 10 2011 084 406.6 filed on Oct. 13, 2011, and is incorporated herein by reference in its entirety.

TECHNICAL FIELD

Various embodiments relate to a converting element and to an arrangement including at least one light-emitting diode and a converting element. Converting elements are used for optoelectronic components in order to set the color locus and the color temperature of the emitted light. Many light-emitting diodes emit a blue or bluish light, which has to be converted into a more or less color-neutral light by suitable phosphors. As a result of the strong absorption of blue light, the relevant phosphors and the converting elements provided therewith have a warm-white or even yellowish to orange inherent color. Such a body color of the converting element, which is no longer color-neutral and appears whenever the light-emitting diode fitted behind said converting element is switched off, is usually perceived as disturbing.

BACKGROUND

In order to improve the appearance of the light exit surfaces—formed from converting elements—of light-emitting diodes, light-emitting diode arrangements and other products based on light-emitting diodes, attempts are made to impart a more highly color-neutral appearance to the converting element by means of a material layer placed in front. The material layer at least partly shields the converting element from the externally incident light from the standpoint of the observer. By way of example, an outer enveloping bulb or some other capping layer or coating is applied, which can also have scattering properties. Scattering can be achieved, for example, by the roughening of the surface of such a capping layer, by incorporated scattering particles or air bubbles or by a capping layer which, for example, is translucent but not completely transparent. The scattering has the effect that when the light-emitting diode is switched off, the inherent color of the phosphor and of the converting element admixed therewith is not visible or is visible only with attenuation. In return, it is conventionally also accepted that the same properties of the capping layer lead to disadvantages during the operation of the light-emitting diode. In particular, it is accepted that the scattering of the capping layer of the converting element leads to light losses when the light-emitting diode emits light. At the present time there is no prospect of a satisfactory solution.

SUMMARY

Various embodiments provide a better neutralization of the color impression of converting elements, in particular those for light-emitting diodes with colored emission, without having to accept the disadvantages hitherto associated therewith for the light emission. In particular, the intention is to provide a converting element and an arrangement including a converting element and at least one light-emitting diode in which, on the one hand, a more neutral color impression of the converting element when the light-emitting diode is switched off and, on the other hand, a higher luminous efficiency when the light-emitting diode is switched on are achieved.

Various embodiments provide the converting element which, in addition to the matrix material (i.e. the basic composition of the converting element) and the phosphor, also includes a (at least one) further component, wherein the further component is either a thermochromic dye or a phase change medium (i.e. a phase change material). While it is conventionally assumed that the material which is intended to be placed in front of the converting element has the same optical properties (with regard to its color, its light transmissivity and its scattering behavior), in the on state and off state and these properties therefore have to be balanced between the requirements in the on state and in the off state, the disclosure is based on the fundamental concept of deliberately using materials having variable optical properties dependent on the ambient conditions and of combining these temperature-dependent properties with the properties of the phosphor.

In accordance with a first embodiment, a thermochromic dye is used as the further component. Such a dye or such a pigment has the property that its color undergoes a color change depending on the temperature and thus, below a certain phase transition temperature, has a different color and often also a different light transmissivity than above said temperature. In the case of the thermochromic dyes, which are incidentally plastics, the phase transition temperature is above room temperature of typically 20°; the phase transition temperature is typically between 30 and 70° C.

The disclosure makes use of the fact that a light-emitting diode influences the converting element fitted in direct or in any case relatively direct proximity to it not only by virtue of the emitted radiation, but also by virtue of the generated heat, whether by virtue of the heat that emerges from the light-emitting diode itself or by virtue of the heat that arises in the converting element owing to the Stokes loss, if the phosphor emits fluorescent light having a longer wavelength than the absorbed wavelength. Therefore, it is proposed to provide a converting element with a further component in addition to the phosphor, which further component reacts to the heat that is generated by the light-emitting diode and/or arises in the converting element, and changes its optical properties as a result. In this case, consideration is given only to those materials for which the change in the optical properties thereof is reversible, such that after the light-emitting diode has been switched off and after gradual cooling to just before room temperature is reached, the phase transition temperature of the further component is undershot again.

For this purpose, it is proposed to use, for example, those thermochromic dyes which have an inherent color (that is to say are not black, gray or white) at room temperature and which are non-transparent at room temperature, but are colorless and transparent at temperatures above the phase transition temperature. Such a thermochromic dye becomes colorless and transparent only as a result of heating. This combination of optical properties at high and low temperatures makes it possible that the light from the switched-on, hot light-emitting diode, upon passing through the converting element, is altered in color only by the phosphor, but not or only insignificantly by the thermochromic dye. In the switched-off, cold state, by contrast, when the light-emitting diode is switched off, the inherent color and/or the non-transparency of the thermochromic dye—in combination with the inherent color of the phosphor—lead to a balanced, neutral color impression. In this regard, by way of example, a thermochromic dye whose inherent color, below the phase transition temperature, corresponds approximately to that of the light from the light-emitting diode for which the converting element is intended can compensate for the inherent color of the phosphor in the off state. For this purpose, such a thermochromic dye having a chromatic color in the cold state, for example blue is preferably used (corresponding to a yellowish-orange phosphor for blue LEDs).

Moreover, the use of an additional component having a temperature-dependent appearance opens up new possibilities for the embodiment of the layers to be placed in front of a light-emitting diode. In this regard, by way of example, the thermochromic dye need not be arranged as a separate layer in front of a conventional, phosphor-containing converting element from the standpoint of the observer, but rather can also be jointly mixed with the phosphor in the basic material of the converting element. In the simplest case, the thermochromic dye just like the phosphor could be distributed homogeneously in the matrix material of the converting element.

Instead of a thermochromic pigment that is chromatic, i.e. colored, at room temperature, it is also possible to use a—at room temperature—colorless but non-transparent white, gray or black thermochromic substance. Although no color compensation of the (usually yellowish or orange), inherent color of the phosphor is achieved here, the undesired hue of the phosphor is masked by the non-transparency of the thermochromic substance—in conjunction with its neutral inherent color. In this case, the thermochromic substance is for example embodied as a compact, separate outer layer of the converting element or in any case arranged in such an outer partial layer of the converting element.

In accordance with a second embodiment, a phase change medium (phase change material) is used as the further component.

In the case of such a material, as a result of the phase transition that commences in the event of a temperature change, although there is no change directly in the inherent color, the degree of reflectivity changes. The reason for this is a transition between a crystalline state below the phase transition temperature and an amorphous state above the phase transition temperature. The transition between the two states is associated with a change in the reflectivity of the phase transition material of the order of magnitude of 30% or more.

Phase change media are conventionally used in semiconductor circuits, where they are used for nonvolatile memory cells owing to the change in their electrical conductivity that is associated with the phase transition. In rewritable CDs, too, phase change materials are used owing to the different extents of their reflection behavior; the intensity of the laser beam used can be varied in order to convert the crystalline state into the amorphous state, or vice versa, the laser energy supplied diffusing very rapidly in both cases.

The conditions are different in the converting element for a light-emitting diode; the light-emitting diode and the converting element cool only gradually, such that the lower-energy, crystalline and more strongly reflective state of the phase change medium is automatically reached during each cooling process when the phase transition temperature is undershot. Therefore, the phase change medium reaches the crystalline state again by itself even without external action, albeit with a certain time delay after the light-emitting diode has been switched off. However, as soon as the light-emitting diode has become hot after it has been started up, the phase change medium is in its amorphous state of lower reflectivity.

In the cold state, therefore, the light impinging on the converting element from the standpoint of the observer is reflected for the most part by the phase change medium and thus masks the inherent color of the phosphor. In the hot, amorphous state, by contrast, the decrease in the reflectivity enables light to pass through the converting element toward the outside better than in conventional converting elements whose reflectivity and scattering behavior do not exhibit temperature dependence.

The phase change media should be resistant toward the thermal loading of a light-emitting diode such that they can also be fitted directly to the light-emitting diode chip.

In particular chalcogenides, i.e. compounds of elements of the sixth main group, that is to say of oxygen, sulfur, selenium and/or tellurium, with more strongly electropositive elements, can, provided that they are phase change media, be used as the further component of a converting element. Ge—Te—Sb, a compound of germanium and antimony with tellurium, shall be mentioned here as an example.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIGS. 1 to 4 show different embodiments of a converting element,

FIG. 5 shows a schematic illustration of an arrangement including a light-emitting diode and a converting element.

DETAILED DESCRIPTION

Figure 6:
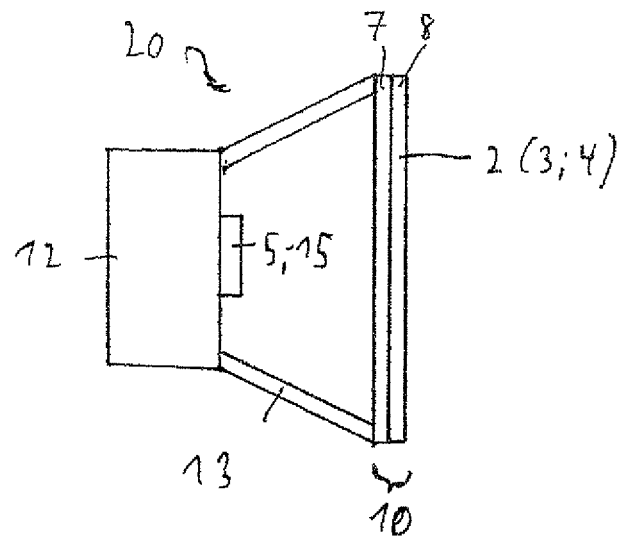
FIG. 6 shows an arrangement including a light-emitting diode and a converting element in accordance with a first embodiment.

The following detailed description refers to the accompanying drawing that show, by way of illustration, specific details and embodiments in which the disclosure may be practiced.

FIG. 1 shows schematically and as an excerpt a converting element 10, which serves for example for converting light from a blue light-emitting diode or a plurality of blue light-emitting diodes into white (or in any case more strongly color-neutral) light. The converting element can be shaped, as illustrated, as a plane-parallel plate, but likewise also as a curved shaped part (for instance composed of glass, plastic or some other basic material). The converting element can also be embodied as an optical element, for instance as a concave lens or as a convex lens. Moreover, the converting element can also be shaped as a bulb or other attachment for one or a plurality of light-emitting diodes.

The converting element 10 principally consists of a matrix material 6. At least one phosphor 1 is embedded into said matrix material in a conventional manner, said at least one phosphor being distributed homogeneously, for example. A conventional converting element, which does not contain any further component in addition to these constituents, is transparent and, owing to the phosphor, colored, for example with yellow to orange coloration. In a conventional converting element, both the transparency and the hue of the converting element are independent of the ambient temperature and thus independent of whether the light-emitting diode (arranged in proximity to the converting element) is switched on or switched off.

According to the disclosure, however, the converting element also contains an additional, further component 2, which fundamentally alters the optical properties of the converting element. In accordance with a first embodiment (FIG. 1), this involves a thermochromic dye. Therefore, unlike conventional practice, the appearance of the converting element is no longer independent of the ambient temperature, but rather varies in a temperature-dependent manner. It is only above a phase transition temperature, which is rapidly exceeded after the light-emitting diode has been switched on, that the thermochromic dye and thus the converting element overall becomes transparent and colorless; below the phase transition temperature, however, it is preferably non-transparent or at most translucent, i.e. at most partly transparent. Moreover, the converting element now has at room temperature a neutral inherent color (that is to say white, gray or black), which is no longer perceived as disturbing in terms of color, as a result of the inherent color of the thermochromic dye that is present below the phase transition temperature, said inherent color being superimposed on the (temperature-independent) inherent color of the phosphor and preferably being complementary thereto. The converting element has this appearance whenever the light-emitting diode is switched off or in any case already a short time after the light-emitting diode has been switched off, as soon as the converting element has cooled below the phase transition temperature of the thermochromic dye. If the light=–emitting diode has been switched on and the converting element has been heated above the phase transition temperature of its thermochromic dye, the converting element is transparent and likewise offers a color-neutral impression; the thermochromic dye here is colorless and transparent and therefore does not impair the light from the light-emitting diode having colored emission, said light being converted color-neutrally with the aid of the phosphor, such impairment otherwise being expected in the case of a conventional dye having a temperature-independent appearance.

The converting element according to the disclosure therefore has an appearance that is dependent on the ambient temperature, both with regard to its inherent color overall (composed of the inherent colors of phosphor and thermochromic dye) and with regard to its light transmissivity.

FIG. 2 shows an alternative embodiment of a converting element, wherein a phase change medium 4, for example a chalcogenide, is provided as the further component 2. The phase change medium 4 does not have an inherent color in the sense of a dye, but has different states of matter and thus different extents of reflectivity above and below its transition temperature. Above its phase transition temperature, the phase change medium 4 is amorphous and relatively weakly reflective, whereas below the transition temperature (and thus at room temperature) it is crystalline, in particular metallic and significantly more strongly reflective. In FIG. 2, the phase change medium 4 is not provided as a compact layer, but rather distributed in the matrix material 6 (in the same way as the phosphor 1). The concentration and spatial distribution of the phase change medium 4 should be suitably adapted in order to ensure a sufficient transparency in the hot state (i.e. when the light-emitting diode emits light). At room temperature, by contrast, the high reflectivity of the phase change medium 4 shields the inherent color of the phosphor 1 to the greatest possible extent from outside; the converting element appears color-neutral to the observer.

FIG. 3 shows an embodiment of a converting element 10, wherein the further component 2 is spatially separated from the phosphor 1 or in any case is spatially distributed differently than the phosphor 1. In a first layer 7, the phosphor 1 is situated in the matrix material 6; as a result, this lower or rear layer 7 has yellow or orange coloration, for example. The further component 2 is distributed in a further, separate layer 8, which can also be a partial layer 9 of the matrix material 6. Said further layer 8 or 9 can furthermore be provided with phosphor 1 or otherwise be free of phosphor. The further component 2 in FIG. 3 is either a thermochromic dye 3 (as in FIG. 1) or a phase change medium 4 (as in FIG. 2).

FIG. 4 shows a further embodiment of a converting element 10, wherein the further, separate layer 8 is formed exclusively from the further component 2, which thus forms a compact, preferably very thin layer. The layer thicknesses and layer thickness ratios in FIGS. 3 and 4 are not illustrated to scale. In FIGS. 3 and 4, in each case the upper, separate layer 8 forms that side which will face the observer, whereas the lower layer 7 will face toward the rear in the direction of the light-emitting diode or will even be fixed directly thereto.

FIG. 5 shows a schematic arrangement including at least one light-emitting diode 5 and a converting element, the constituent parts of which are illustrated schematically, to be precise in a manner spatially separated from one another. The light-emitting diode 5 is formed on or in a light-emitting diode chip 15. In a first layer 7, which would correspond to a conventional converting element, phosphor 1 is distributed in the matrix material. A second, separate layer 8 contains a further component 2, either as main constituent or mixed in some other material (for example the same matrix material). The further component 2 is once again either a thermochromic dye 3 or a phase change medium 4. FIG. 5 shows that the phosphor should be arranged between the light-emitting diode 5 and the further component 2. Consequently, the further component 2 is situated on that side of the phosphor-containing layer 7 which faces away from the light-emitting diode 5.

If a thermochromic dye 3 is used as the further component 2, the layer 8 or 9 is non-transparent and colored (or, instead of a chromatic color, black, gray or white) at low temperature, wherein the color impression compensates for that of the phosphor. At high temperature, by contrast, the layer 8 or 9 is transparent and colorless.

If a phase change medium 4 is used as the further component 2, the layer 8 or 9 is non-transparent at low temperature on account of its high reflectivity, but is largely transparent and colorless at high temperature.

In the case of both groups of materials, therefore, below the phase transition temperature Tc, in particular at room temperature Tr, the light impinging from outside (i.e. from the right in FIG. 5) is absorbed in the layer 8 or 9 containing the further component 2, or is in any case reflected, as is illustrated on the basis of the continuous, uninterrupted arrows in FIG. 5. As a result, the inherent color of the phosphor of the layer 7 is not visible from outside. Above the phase transition temperature Tc, by contrast, in the case of both groups of materials, the layer 8 or 9 including the further component 2 is colorless and transparent, as is illustrated with the aid of the dashed arrows in FIG. 5.

FIG. 6 shows a first embodiment of an arrangement including at least one light-emitting diode 5 and a converting element 10. In this arrangement 20, the converting element 10 is arranged at a distance from the light-emitting diode 5 or the light-emitting diode chip 15. One or else a plurality of light-emitting diodes 5 or light-emitting diode chips 15 can be situated on a carrier 12. By means of a mount 13, the converting element 10 is held at a defined distance in front of the light-emitting diode arrangement. The converting element 10, which is illustrated as a plane-parallel plate here for the sake of simplicity, is arranged such that that layer 8 which contains the further component 2 faces away from the light-emitting diode 5. Consequently, from the standpoint of the observer, the further component 2 is situated on the outside in front of the phosphor 7. Alternatively, as illustrated in FIG. 1 or 2, the phosphor 1 and the further component 2 can be mixed homogeneously with one another and in the matrix material; the converting element then requires only a single layer. In the case of the design from FIG. 6, which corresponds to that of "remote phosphor" applications, a neutral appearance of the arrangement at room temperature is achieved by virtue of the thermochromic dyes or phase change media used according to the disclosure; the hitherto yellowish-orange inherent color of the phosphor is neutralized.

Figure 7:
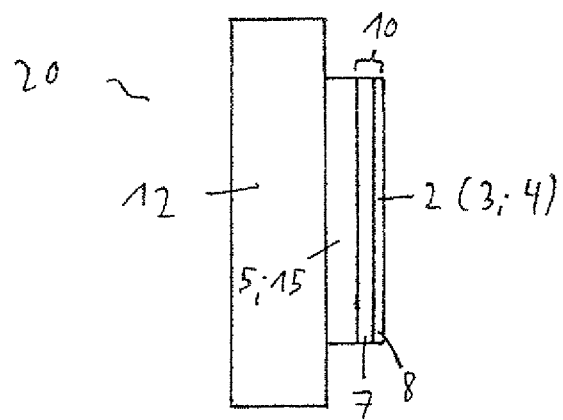
FIG. 7 shows an arrangement including a light-emitting diode and a converting element in accordance with a second embodiment.

FIG. 7 shows a second embodiment, wherein the converting element 10 is arranged directly on the light-emitting diode chip 15 or on the light-emitting diode 5 formed thereby. If the phosphor 1 and the further component 2 are not distributed homogeneously in the converting element, two different layers 7, 8 again exist, wherein the layer 8 containing the thermochromic dye 3 or the phase change medium 4 is arranged on the outer side of the converting element 10 facing away from the light-emitting diode 5.

In particular, the thermochromic dyes or phase change medium mentioned in the description and/or in the patent claims of this application can be used for all of the embodiments in FIGS. 1 to 7.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A converting element for converting emitted light from one
or more light-emitting diodes, the converting element comprising:
a matrix material and at least one phosphor,
wherein
the converting element further comprises a component, which is either a thermochromic dye or a phase change medium,
wherein
the component is a phase change medium which is crystalline and strongly reflective at room temperature and which is amorphous and more weakly reflective above a phase transition temperature that is greater than room temperature, and
wherein
both the phosphor and the component are distributed in the matrix material of the converting element.

2. The converting element as claimed in claim 1, wherein
the component is a thermochromic dye which has an inherent color and is non-transparent at room temperature and which is colorless and transparent above a phase transition temperature that is greater than room temperature.

3. The converting element as claimed in claim 1, wherein
the phosphor has an inherent color, and component is a thermochromic dye which at room temperature has an inherent color that blocks an inherent color of the phosphor.

4. The converting element as claimed in claim 1, wherein
the phosphor has a yellow to orange inherent color, and wherein the component is a thermochromic dye which has a blue or blue to violet inherent color at room temperature.

5. The converting element as claimed in claim 1, wherein
the component is a thermochromic dye which is non-transparent and black, gray or white at room temperature and which is transparent and colorless above a phase transition temperature that is greater than room temperature.

6. The converting element as claimed in claim 1, wherein
the component is present as a separate layer or is arranged in a partial layer of the converting element that is free of phosphor.

7. The converting element as claimed in claim 1, wherein
the component is a phase change medium including a chalcogenide.

8. The converting element as claimed in claim 7, wherein
the phase change medium is a substance containing at least one or a plurality, of the elements germanium, tellurium and antimony.

9. An arrangement comprising at least one light-emitting diode and a converting element,
wherein
the converting element comprises a matrix material and at least one phosphor,
wherein
the converting element further comprises a component, which is either a thermochromic dye or a phase change medium,
wherein
in the converting element the phosphor and the component are arranged in a manner spatially separated from one another, wherein the phosphor is arranged nearer the light-emitting diode than the component, and
wherein
the converting element is arranged directly on a light-emitting diode chip in which the light-emitting diode is embodied.

10. The arrangement as claimed in claim 9, wherein
the light-emitting diode is a light-emitting diode which emits blue light at least a portion of such blue light is converted into light of other colors by the phosphor.

11. The arrangement as claimed in claim 9, wherein
the converting element is not in contact with the at least one light-emitting diode.

* * * * *